US012727274B2

(12) United States Patent
Kim et al.

(10) Patent No.: US 12,727,274 B2
(45) Date of Patent: Sep. 1, 2026

(54) IMAGE SENSOR

(71) Applicant: SAMSUNG ELECTRONICS CO., LTD., Suwon-si (KR)

(72) Inventors: Youngrae Kim, Suwon-si (KR); Sachoun Park, Suwon-si (KR); Daeuk Jung, Suwon-si (KR); Jeongjin Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 280 days.

(21) Appl. No.: 18/540,418

(22) Filed: Dec. 14, 2023

(65) Prior Publication Data

US 2024/0413182 A1 Dec. 12, 2024

(30) Foreign Application Priority Data

Jun. 8, 2023 (KR) ........................ 10-2023-0073775

(51) Int. Cl.
*H10F 39/00* (2025.01)
*G02B 3/00* (2006.01)
*H10F 39/18* (2025.01)

(52) U.S. Cl.
CPC ....... *H10F 39/8063* (2025.01); *H10F 39/024* (2025.01); *H10F 39/182* (2025.01); *H10F 39/805* (2025.01); *H10F 39/8053* (2025.01); *H10F 39/8057* (2025.01); *H10F 39/809* (2025.01); *H10F 39/811* (2025.01); *G02B 3/0062* (2013.01)

(58) Field of Classification Search
CPC .... H10F 39/809; H10F 39/182; H10F 39/199; H10F 39/8063; H10F 39/807; H10F 39/805; H10F 39/024; H10F 39/8057; H10F 39/811; H10F 39/8053
USPC ...................................... 257/432; 438/48, 65
See application file for complete search history.

(56) References Cited

U.S. PATENT DOCUMENTS

| | | | |
|---|---|---|---|
| 7,605,857 B2 | 10/2009 | Kim | |
| 7,605,980 B2 | 10/2009 | Kim | |
| 9,285,510 B2 | 3/2016 | Kawabata et al. | |
| 11,372,312 B2 | 6/2022 | Pyo et al. | |
| 2006/0170810 A1 | 8/2006 | Kim | |
| 2008/0151378 A1 | 6/2008 | Kim | |
| 2015/0001662 A1 | 1/2015 | Kawabata et al. | |
| 2016/0033688 A1* | 2/2016 | Wu | G02B 5/201 216/26 |

(Continued)

FOREIGN PATENT DOCUMENTS

| | | |
|---|---|---|
| JP | 2007-335723 A | 12/2007 |
| JP | 2008-244225 A | 10/2008 |

(Continued)

*Primary Examiner* — Didarul A Mazumder
(74) *Attorney, Agent, or Firm* — Sughrue Mion, PLLC

(57) ABSTRACT

An image sensor includes: a first substrate including: a first side, a second side, a pixel array region, and an edge region; and a micro lens array on the second side, which includes micro lenses. Each of the micro lenses includes a first lens layer and a second lens layer on the first lens layer. A second mean curvature radius of the second lens layer is smaller than a first mean curvature radius of the first lens layer. A first eccentric degree of the second lens layer on an edge of the pixel array region is greater than a second eccentric degree of the second lens layer at a center of the pixel array region.

20 Claims, 13 Drawing Sheets

(56) References Cited

U.S. PATENT DOCUMENTS

| | | | | |
|---|---|---|---|---|
| 2018/0166594 | A1* | 6/2018 | Chen | H10F 77/413 |
| 2018/0309944 | A1* | 10/2018 | Lee | G09G 5/363 |
| 2020/0387050 | A1 | 12/2020 | Pyo et al. | |
| 2021/0120198 | A1* | 4/2021 | Kim | H10F 39/8053 |
| 2021/0193721 | A1* | 6/2021 | Kim | G01J 1/0488 |
| 2022/0139989 | A1* | 5/2022 | Park | H10F 39/8063 257/432 |

FOREIGN PATENT DOCUMENTS

| | | | |
|---|---|---|---|
| JP | 2017-79243 | A | 4/2017 |
| JP | 2021-111809 | A | 8/2021 |

* cited by examiner

503

IMAGE SENSOR

CROSS-REFERENCE TO RELATED APPLICATION

This application is based on and claims priority under 35 U.S.C. § 119 to Korean Patent Application No. 10-2023-0073775, filed on Jun. 8, 2023, in the Korean Intellectual Property Office, the disclosure of which is incorporated by reference herein in its entirety.

BACKGROUND

1. Field

The disclosure relates to a semiconductor device such as an image sensor.

2. Description of the Related Art

An image sensor is a semiconductor device for converting optical images into electrical signals. The image sensor may be classified into a charge coupled device (CCD) type and a complementary metal oxide semiconductor (CMOS) type. The CMOS-type image sensor may be referred to as a CMOS image sensor (CIS). The CIS has pixels arranged in a two-dimensional way. The respective pixels include a photodiode and micro lenses for gathering light and supplying the gathered light to respective photodiodes. The photodiode converts the supplied light, through the micro lens, into electric signals.

SUMMARY

An embodiment may increase focusing efficiency of a micro lens.

An embodiment may increase focusing uniformity of a micro lens at an edge of a pixel array region of an image sensor.

According to an aspect of the disclosure, an image sensor includes: a first substrate including: a first side, a second side that is opposite to the first side, a pixel array region including unit pixels, and an edge region surrounding the pixel array region; and a micro lens array on the second side, the micro lens array including micro lenses, wherein each of the micro lenses includes a first lens layer and a second lens layer on the first lens layer, wherein a second mean curvature radius of the second lens layer is smaller than a first mean curvature radius of the first lens layer, wherein a first eccentric degree of the second lens layer on an edge of the pixel array region is greater than a second eccentric degree of the second lens layer at a center of the pixel array region, wherein each of the first eccentric degree and the second eccentric degree corresponds to a degree to which a center optical axis of the second lens layer deviates from the center optical axis of the first lens layer, and wherein a direction in which the center optical axis of the second lens layer is eccentric from the center optical axis of the first lens layer is toward the center of the pixel array region.

According to an aspect of the disclosure, an image sensor includes: a first substrate including: a first side, a second side that is opposite to the first side, a pixel array region comprising unit pixels, and an edge region; an antireflection structure on the second side; a pixel separator on the first substrate and separating the unit pixels; a color filter in the antireflection structure; a micro lens array on the color filter and comprising micro lenses; a first interlayer insulating layer on the first side of the first substrate; a first wiring layer in the first interlayer insulating layer; a second interlayer insulating layer below the first interlayer insulating layer; a second wiring layer in the second interlayer insulating layer; and a second substrate below the second interlayer insulating layer, wherein each of the micro lenses comprises a first lens layer and a second lens layer on the first lens layer, wherein a second mean curvature radius of the second lens layer is smaller than a first mean curvature radius of the first lens layer, wherein a first eccentric degree of the second lens layer on an edge of the pixel array region is greater than a second eccentric degree of the second lens layer at a center of the pixel array region, wherein each of the first eccentric degree and the second eccentric degree corresponds to a degree to which a center optical axis of the second lens layer deviates from the center optical axis of the first lens layer, and wherein a direction in which the center optical axis of the second lens layer is eccentric from the center optical axis of the first lens layer is toward a center of the pixel array region.

According to an aspect of the disclosure, an image sensor includes: a first sub-chip including: a first substrate including: a first side, a second side that is opposite to the first side, an array region including unit pixels, and an edge region, an antireflection structure on the second side, a pixel separator on the first substrate and separating the unit pixels, a color filter in the antireflection structure, a micro lens array on the color filter, a first interlayer insulating layer on the first side of the first substrate, and a first wiring layer in the first interlayer insulating layer; a second sub-chip including: a second substrate below the first interlayer insulating layer, a second interlayer insulating layer below the second substrate, and a second wiring layer in the second interlayer insulating layer; a third sub-chip including: a third interlayer insulating layer below the second interlayer insulating layer, a third wiring layer in the third interlayer insulating layer, and a third substrate below the third interlayer insulating layer, and micro lenses including a first lens layer and a second lens layer on the first lens layer, wherein a second mean curvature radius of the second lens layer is smaller than a first mean curvature radius of the first lens layer, wherein a first eccentric degree of the second lens layer disposed on an edge of a pixel array region is greater than a second eccentric degree of the second lens layer disposed at a center of the pixel array region, wherein each of the first eccentric degree and the second eccentric degree corresponds to a degree to which a center optical axis of the second lens layer deviates from the center optical axis of the first lens layer, and wherein a direction in which the center optical axis of the second lens layer is eccentric from the center optical axis of the first lens layer is toward a center of the pixel array region.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION

Figure 1:
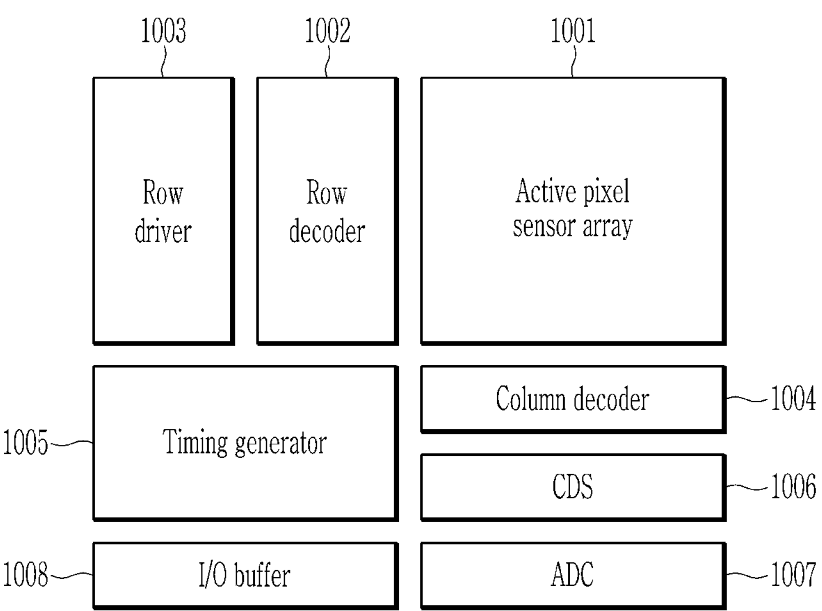
FIG. 1 shows a block diagram of an image sensor according to an embodiment.

Embodiments will be described more fully hereinafter with reference to the accompanying drawings. As those skilled in the art would realize, the described embodiments may be modified in various different ways, all without departing from the spirit or scope of the disclosure.

The drawings and the descriptions are to be considered as illustrative and not as restrictive. Throughout the specification, the same reference numbers indicate the same constituent elements.

The size and thickness of each configuration shown in the drawings are arbitrarily shown for better understanding and ease of description, and the disclosure is not limited thereto. The thicknesses of layers, films, panels, regions, etc., may be exaggerated for clarity. The thicknesses of some layers and areas may be exaggerated.

The singular forms are intended to include the plural forms as well, unless the context clearly indicates otherwise.

In the specification and the claims, the term "and/or" is intended to include arbitrary combinations of the terms "and" and "or" for the purposes of meaning and interpretation. For example, the expression of "A and/or B" may be understood to signify "A, B, or A and B".

In the specification and claims, the phrase "at least one of" is intended to include the meaning of "at least one selected from the group of," for the purpose of meaning and interpretation. For example, "at least one of A and B" may be understood to signify "A, B, or A and B".

Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the disclosure.

When an element, such as a layer, a film, a region, or a substrate is described to be "above" another element, it may be directly above another element or there may be an intermediate element. In contrast, when a first element is described to be "directly above" a second element, there is no intermediate element. Throughout the specification, the term "above" a target must be "understood as being disposed above or below the target element, and does not necessarily signify "above" with respect to an opposite direction of gravity.

For example, spatially relative terms "below" or "above" may be used to facilitate the description of the relationship of one element or a constituent element to other constituent elements as shown in the drawings. The spatially relative terms are intended to include other directions in use or operation in addition to the directions shown in the drawings. For example, when the device shown in the drawing is flipped, the device disposed below another device may be disposed "above" the other device. Therefore, the exemplary term "below" may include lower and upper positions. The device may also be oriented in other directions, the spatially relative term may be analyzed differently depending on the directions.

When an element (or region, layer, portion, etc.) is described to be "connected" or "combined" to another element in the specification, it may be directly disposed, connected, or combined on the above-noted other element, or an element may be disposed therebetween. The term "connected to" or "combined to" may include physical or electrical connections or combinations.

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning that is consistent with their meaning in the context of the relevant art and/or the disclosure, and should not be interpreted in an idealized or overly formal sense, unless expressly so defined herein.

Terms used in the disclosure are used only to describe a specific embodiment, and may not be intended to limit the scope of another embodiment. A singular expression may include a plural expression unless it is clearly meant differently in the context. The terms used herein, including a technical or scientific term, may have the same meaning as generally understood by a person having ordinary knowledge in the technical field described in the disclosure. Terms defined in a general dictionary among the terms used in the disclosure may be interpreted with the same or similar meaning as a contextual meaning of related technology, and unless clearly defined in the disclosure, it is not interpreted in an ideal or excessively formal meaning. In some cases, even terms defined in the disclosure cannot be interpreted to exclude embodiments of the disclosure.

In one or more embodiments of the disclosure described below, a hardware approach is described as an example. However, since the one or more embodiments of the disclosure include technology that uses both hardware and software, the various embodiments of the disclosure do not exclude a software-based approach.

In addition, in the disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with 'more than', a condition described as 'less than or equal to' may be replaced with 'less than', and a condition described as 'more than or equal to and less than' may be replaced with 'more than and less than or equal to'. In addition, hereinafter, 'A' to 'B' means at least one of elements from A (including A) and to B (including B).

FIG. 1 shows a block diagram of an image sensor according to an embodiment.

Referring to FIG. 1, the image sensor may include an active pixel sensor array 1001, a row decoder 1002, a row driver 1003, a column decoder 1004, a timing generator 1005, a correlated double sampler (CDS) 1006, an analog to digital converter (ADC) 1007, and an input and output (I/O) buffer 1008.

The active pixel sensor array 1001 may include a plurality of unit pixels arranged in a two-dimensional (2D) way, and may convert optical signals into electrical signals. The active pixel sensor array 1001 may be driven by driving signals such as a pixel selection signal, a reset signal, and a charge transmitting signal from the row driver 1003. The converted electrical signals may be provided to the correlated double sampler 1006.

The row driver 1003 may provide driving signals for driving unit pixels to the active pixel sensor array 1001 according to decoded results by the row decoder 1002. When the unit pixels are arranged in a matrix form, the driving signals may be provided for respective rows.

The timing generator 1005 may provide timing signals and control signals to the row decoder 1002 and the column decoder 1004.

The CDS 1006 may receive the electric signals generated by the active pixel sensor array 1001 and may hold and sample them. The correlated double sampler 1006 may sample a specific noise level and a signal level caused by the electrical signal, and may output a difference level that corresponds to a difference between the noise level and the signal level.

The ADC 1007 may convert an analog signal that corresponds to the difference level output by the correlated double sampler 1006 into a digital signal and may output the digital signal.

The input and output buffer 1008 may latch the digital signal, and may sequentially output the latched signal to a video signal processor as digital signals according to a decoding result by the column decoder 1004.

Figure 2:
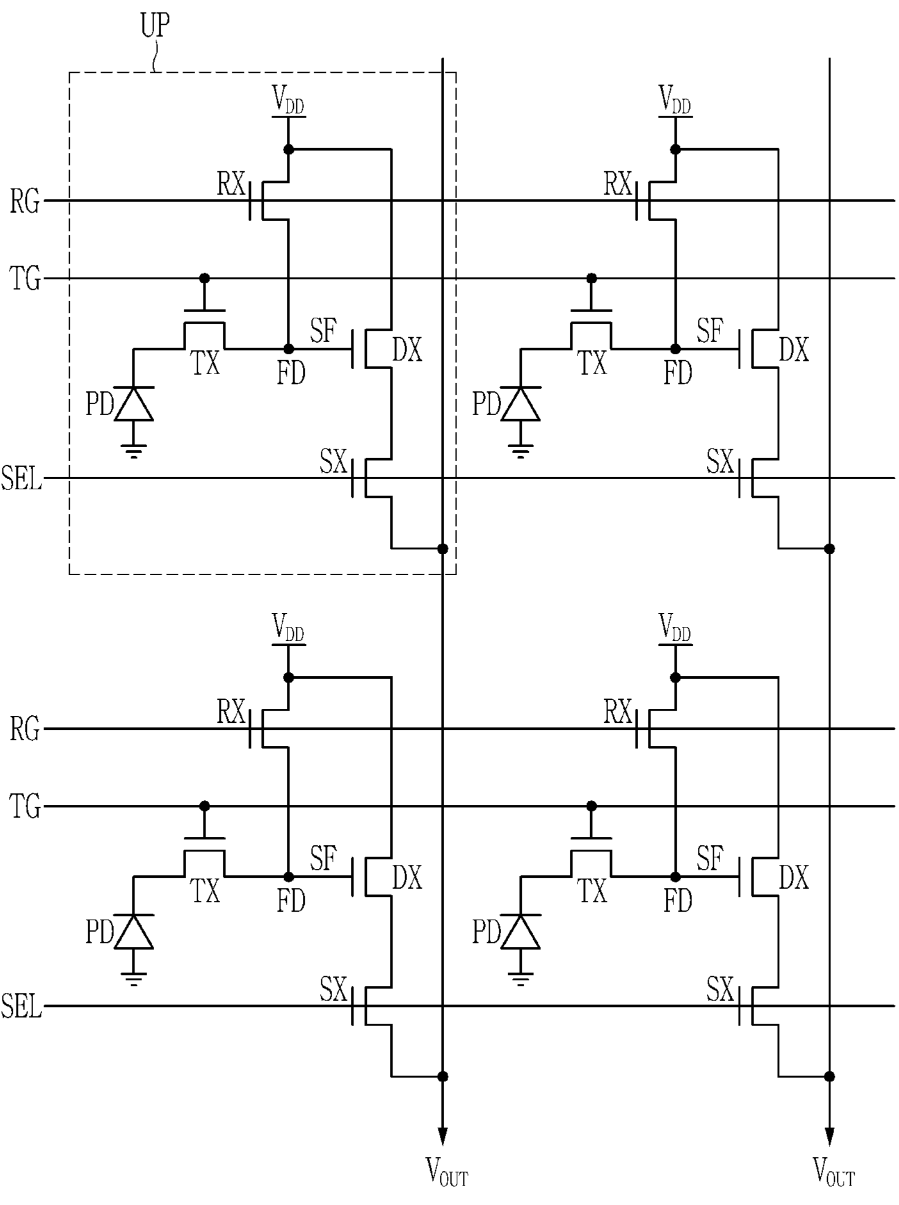
FIG. 2 shows a circuit diagram of an active pixel sensor array of an image sensor according to an embodiment.

FIG. 2 shows a circuit diagram of an active pixel sensor array of an image sensor according to an embodiment.

Referring to FIG. 1 and FIG. 2, the sensor array 1001 may include unit pixels UP, and the unit pixels UP may be arranged in a matrix format. The respective unit pixels UP may include a transmission transistor TX. The respective unit pixels UP may further include logic transistors RX, SX, and DX. The logic transistor may be a reset transistor RX, a selection transistor SX, or a source follower transistor DX. The transmission transistor TX may include a transmission gate TG. The transmission gate TG may be a dual transmission gate in which two transmission gates make a pair. The respective unit pixels UP may further include a photoelectric converter PD and a floating diffusing region FD. The respective unit pixels UP may include at least one photoelectric converter PD. The logic transistors RX, SX, and DX may be shared with each other for the respective unit pixels UP. The respective unit pixels UP may include a corresponding micro lens ML. The respective micro lens ML may gather light and may input the same to the photoelectric converter PD, and may have a double-layered structure. Optical axes of the respective micro lenses ML may be inclined by different angles, depending on positions.

The photoelectric converter PD may generate and store photocharges in proportion to an amount of light input by an outside. The photoelectric converter PD may include a photodiode, a phototransistor, a photogate, a pinned photodiode, and combinations thereof. The transmission transistor TX may transmit the charges generated by the photoelectric converter PD to the floating diffusing region FD. The floating diffusing region FD may receive the charges generated by the photoelectric converter PD and may store them in an accumulative way. The source follower transistor DX may be controlled according to the amount of photocharges accumulated in the floating diffusing region FD.

The reset transistor RX may periodically reset the charges accumulated in the floating diffusing region FD. A drain electrode of the reset transistor RX may be connected to the floating diffusing region FD, and a source electrode may be connected to a power voltage VDD. When the reset transistor RX is turned on, the power voltage VDD connected to the source electrode of the reset transistor RX may be applied to the floating diffusing region FD. Therefore, when the reset transistor RX is turned on, the charges accumulated in the floating diffusing region FD may be discharged and the floating diffusing region FD may be reset.

The source follower transistor DX including a source follower gate electrode SF may function as a source follower buffer amplifier. The source follower transistor DX may amplify a potential change in the floating diffusing region FD, and may output the amplified result to an output line Vout.

The selection transistor SX including a selection gate electrode SEL may select the unit pixels UP to be read for respective rows. When the selection transistor SX is turned on, the power voltage VDD may be applied to a drain electrode of the source follower transistor DX.

Figure 3:
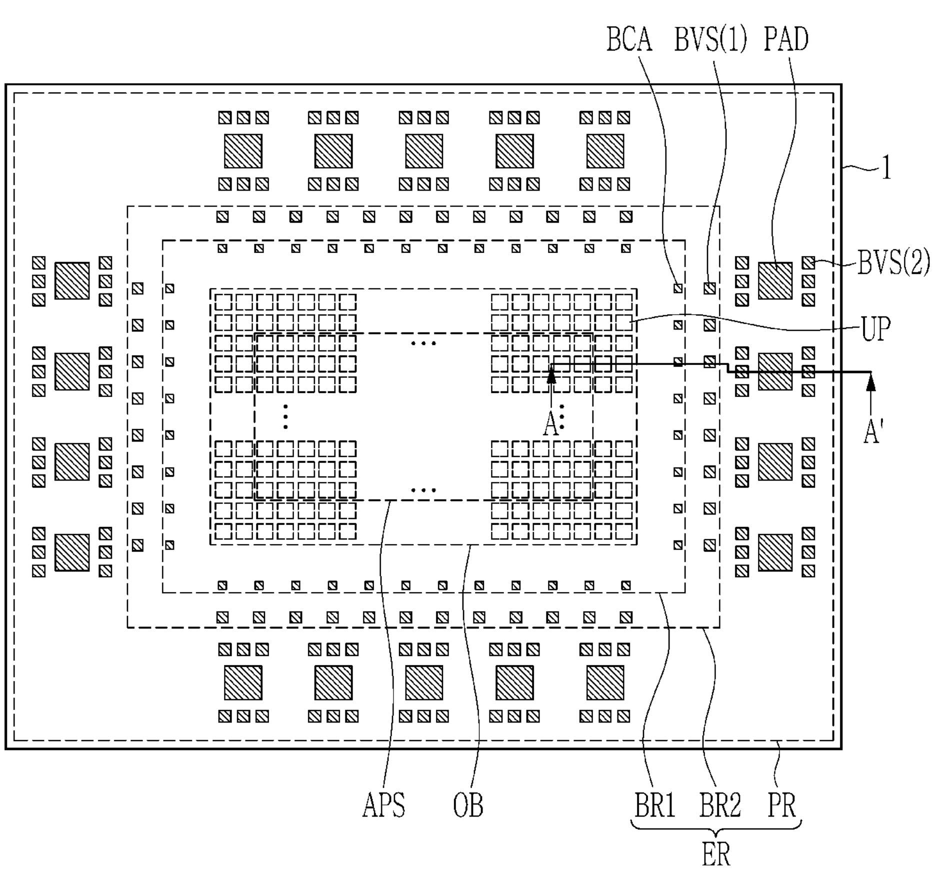
FIG. 3 shows a top plan view of an image sensor according to an embodiment.
Figure 4:
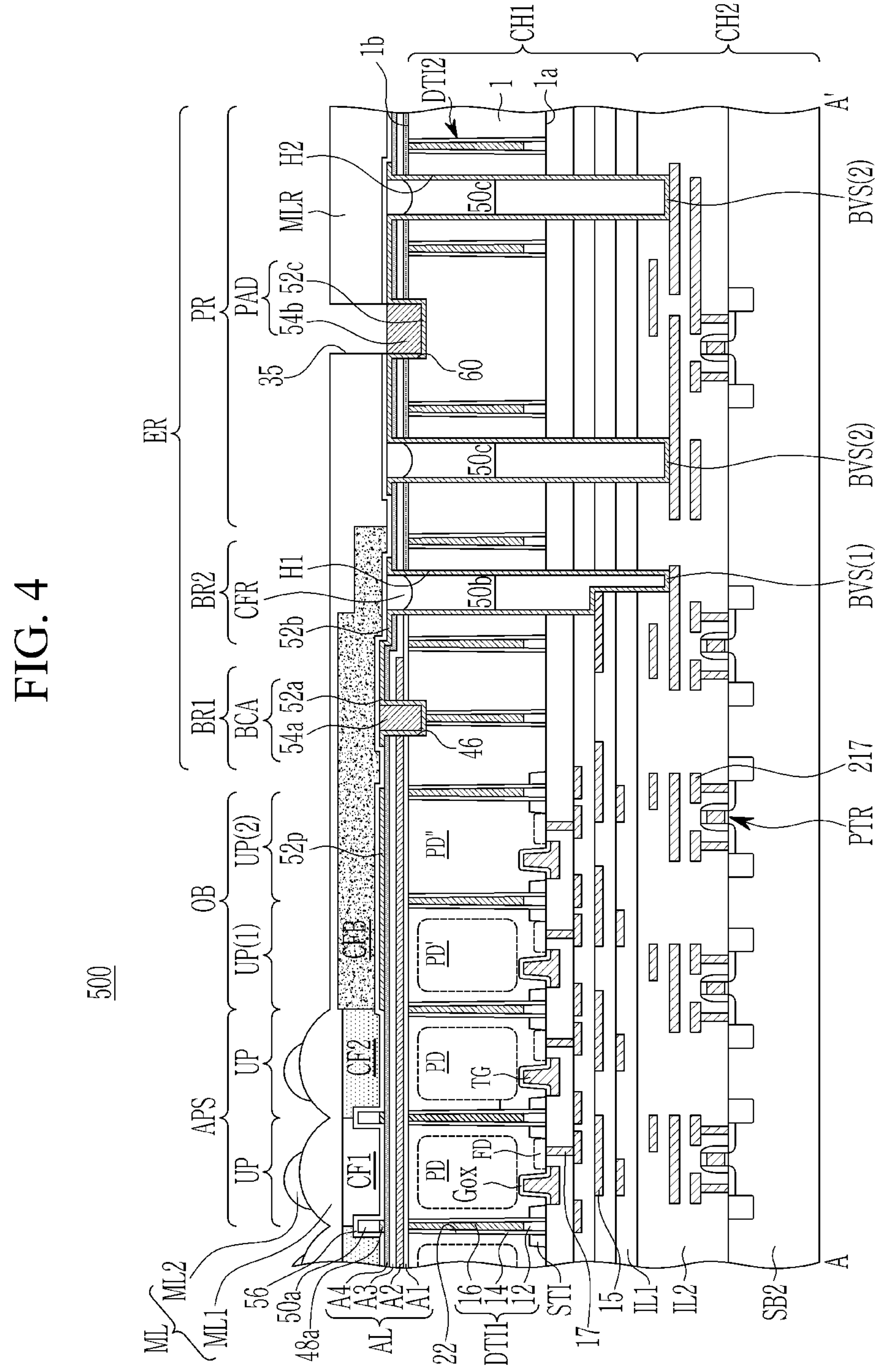
FIG. 4 shows a cross-sectional view with respect to a line A-A' of FIG. 3.
Figure 5:
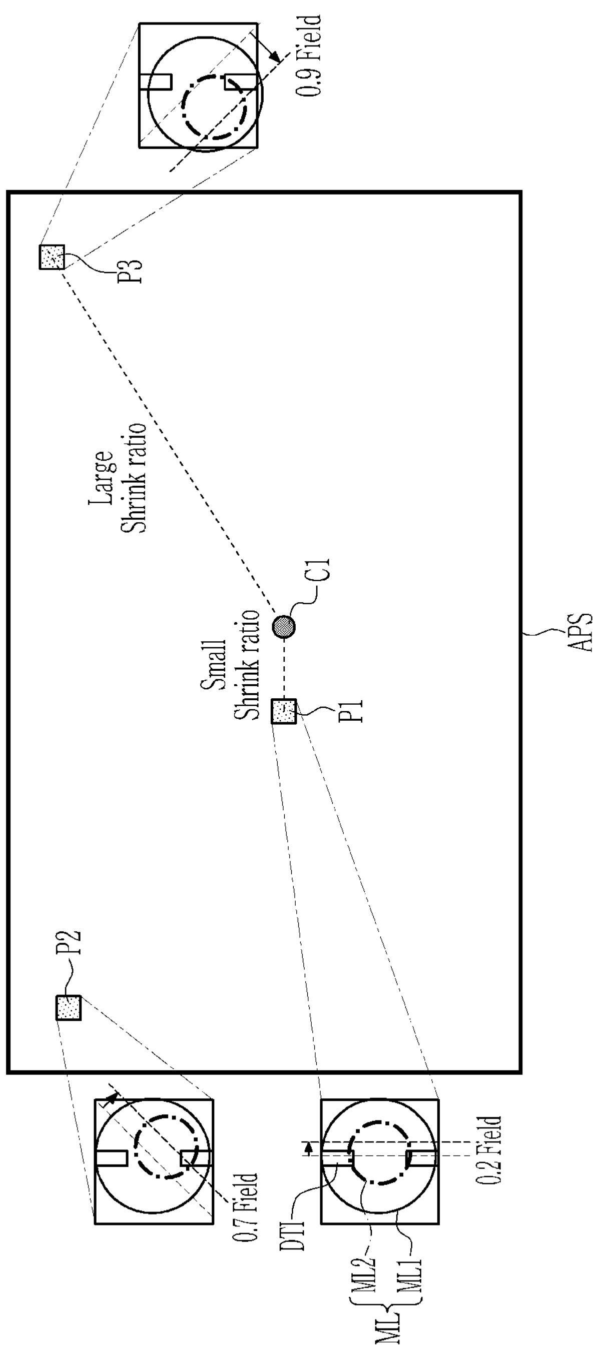
FIG. 5 shows a top plan view of a micro lens respect to respective positions in a pixel array region of an image sensor of FIG. 3.
Figure 6:
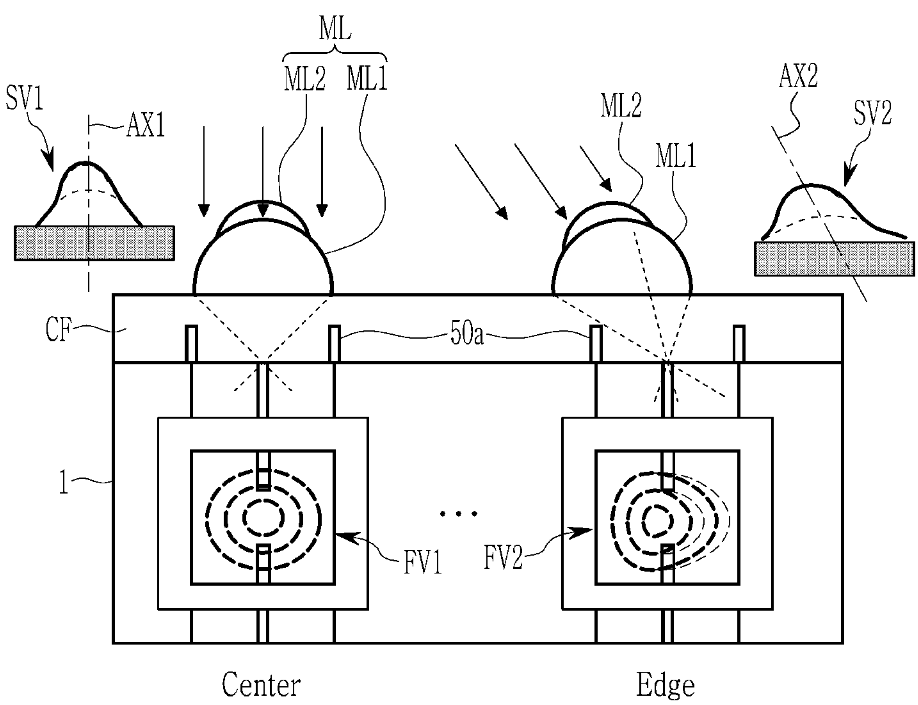
FIG. 6 shows a cross-sectional view of disposition of a micro lens on a center and an edge of a pixel array region of an image sensor of FIG. 3 and FIG. 4.
Figure 7:
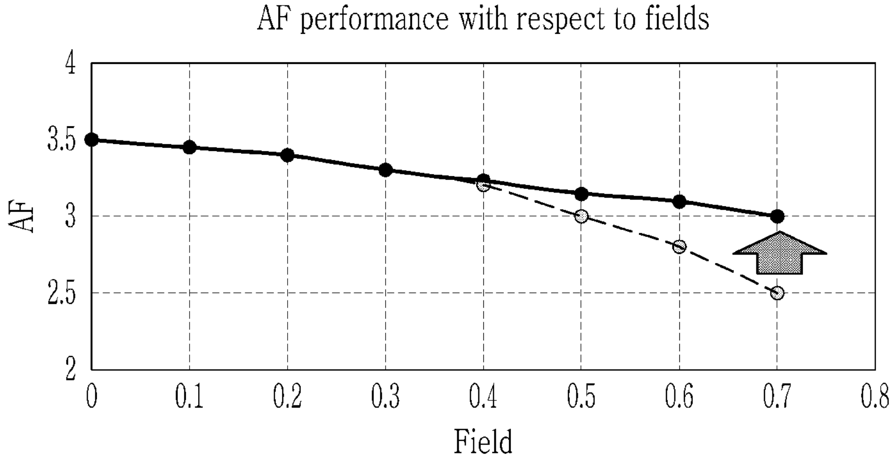
FIG. 7 shows a graph of focusing efficiency of an image sensor according to an embodiment with respect to position in a pixel array region.

FIG. 3 shows a top plan view of an image sensor according to an embodiment. FIG. 4 shows a cross-sectional view with respect to a line A-A' of FIG. 3. FIG. 5 shows a top plan view of a micro lens respect to respective positions in a pixel array region of an image sensor of FIG. 3. FIG. 6 shows a cross-sectional view of disposition of a micro lens on a center and an edge of a pixel array region of an image sensor of FIG. 3 and FIG. 4. FIG. 7 shows a graph of focusing efficiency of an image sensor according to an embodiment with respect to position in a pixel array region.

Referring to FIG. 3 and FIG. 4, the image sensor 500 may have a structure in which first and second sub-chips CH1 and CH2 are bonded. The first sub-chip CH1 may be disposed on the second sub-chip CH2. The first sub-chip CH1 includes a first substrate 1. For example, the first substrate 1 may be a silicon monocrystalline wafer, a silicon epitaxial layer, or a silicon on insulator (SOI) substrate. For example, the first substrate 1 may be doped with first conductive type impurities. For example, the first conductive type may be a p-type. The first substrate 1 includes a front side 1*a* and a rear side 1*b* that are opposite to the front side 1*a*. In the disclosure, the front side 1*a* may be referred to as a first side 1*a*, and the rear side 1*b* may be referred to as a second side 1*b*. The first substrate 1 may include a pixel array region APS, an optical black region OB, and an edge region ER.

The pixel array region APS and the optical black region OB may respectively include unit pixels UP. The optical black region OB may surround the pixel array region APS. The edge region ER may surround the pixel array region APS and the optical black region OB. The edge region ER may include a contact region BR1, a via region BR2, and a pad region PR. The via region BR2 may be disposed between the contact region BR1 and the pad region PR. The pad region PR may be disposed on an outermost portion in the edge region ER.

A first pixel separator DTI1 may be disposed in the first substrate 1 and may separate/define the unit pixels UP in the pixel array region APS and the optical black region OB. The first pixel separator DTI1 may extend to the contact region BR1 of the edge region ER. The first pixel separator DTI1 may have a mesh shape.

Rear side contacts BCA, rear side vias BVS, and rear side conductive pads PAD may be disposed on a rear side 1*b* of the first substrate 1 in the edge region ER. The rear side vias BVS may include first rear side vias BVS(1) and second rear side vias BVS(2).

The first pixel separator DTI1 and the second pixel separators DTI2 may be disposed in a deep trench 22 formed toward the rear side 1*b* from a front side 1*a* of the first substrate 1. The first pixel separator DTI1 and the second pixel separators DTI2 may be frontside deep trench isolations (FDTI). The first pixel separator DTI1 and the second pixel separators DTI2 may respectively include a buried insulation pattern 12, a separated insulation pattern 14, and a separated conductive pattern 16. The buried insulation pattern 12 may be disposed between the separated conductive pattern 16 and a first interlayer insulating layer IL. The separated insulation pattern 14 may be provided between the separated conductive pattern 16 and the first substrate 1 and between the buried insulation pattern 12 and the first substrate 1.

The buried insulation pattern 12 and the separated insulation pattern 14 may be made of an insulating material with a refractive index that is different from that of the first substrate 1. The buried insulation pattern 12 and the separated insulation pattern 14 may include, for example, a silicon oxide. The separated conductive pattern 16 may be spaced from the first substrate 1. The separated conductive pattern 16 may include a polysilicon film or a silicon germanium film to which impurities are doped. The impurities doped to the polysilicon or the silicon germanium film may, for example, be one of boron, phosphorus, arsenide. Alternatively, the separated conductive pattern 16 may include a metal layer.

The first pixel separator DTI1 and the second pixel separators DTI2 have horizontal cross-sections that become narrower when approaching the rear side 1*b* from the front side 1*a* of the first substrate 1 as shown in FIG. 4. The second pixel separator DTI2 may be referred to as a substrate separator.

The photoelectric converters PD may be disposed in the first substrate 1, regarding the unit pixels UP. The photoelectric converters PD may be doped with second conductivity type impurities that are opposite to the first conductivity type. The second conductivity type may, for example, be an N-type. The N-type impurities doped to the photoelectric converter PD may make a PN junction with P-type impurities doped to the adjacent first substrate 1 and may provide a photodiode. At least two photoelectric converters PD may be disposed in one unit pixel UP.

Element separators STI provided near the front side 1*a* may be disposed in the first substrate 1. The first pixel separator DTI1 may penetrate the element separators STI. The element separators STI may limit active regions ACT disposed near the front side 1*a* on the respective unit pixels UP. The active regions ACT may be provided for the transistors TX, RX, DX, and SX of FIG. 2.

Referring to FIG. 4, the transmission gate TG may be disposed on the front side 1*a* of the first substrate 1 on the respective unit pixels UP. A portion of the transmission gate TG may extend into the first substrate 1. The transmission gate TG may be a vertical type. Alternatively, the transmission gate TG may not extend into the first substrate 1 but may be planar, that is, it may be a planar type. The transmission gate TG may be a dual transmission gate in which two separated ones make a pair. A gate insulating layer Gox may be disposed between the transmission gate TG and the first substrate 1. A floating diffusing region FD may be disposed in the first substrate 1 on one side of the transmission gate TG. The second conductivity type impurities may, for example, be doped to the floating diffusing region FD.

The image sensor 500 may be a rear-side light receiving image sensor. Light may be input into the first substrate 1 through the micro lens ML disposed on the rear side 1*b* of the first substrate 1. Electron-hole pairs may be generated at the PN junction by the incident light. The generated electrons may move to the photoelectric converter PD. When a voltage is applied to the transmission gate TG, the electrons may move to the floating diffusing region FD.

A first unit pixel UP(1) and a second unit pixel UP(2) may be disposed in the optical black region OB of the first substrate 1. A black photoelectric converter PD' is provided in the first substrate 1 on the first unit pixel UP(1). A dummy region PD" may be provided in the first substrate 1 on the second unit pixel UP(2). The black photoelectric converter PD' may, for example, be doped with the second conductivity type impurities that are not the first conductivity type. The second conductivity type may, for example, be an N-type. The pixel array region APS may include unit pixels UP. The black photoelectric converter PD' may have a similar structure to the photoelectric converter PD, and may not perform an operation (i.e., an operation for receiving light and generating electrical signals) performed by the photoelectric converter PD. The dummy region PD" may not be doped with impurities. A signal generated by the dummy region PD" may be used as information for removing processing noise.

The first sub-chip CH1 may further include first interlayer insulating layers IL disposed on the front side 1*a*. The first interlayer insulating layers IL may be made of a multilayer of at least one film selected from among a silicon oxide layer, a silicon nitride, a silicon oxynitride layer, a porous low-dielectric layer. First wires 15 may be disposed between or in the first interlayer insulating layers IL. The floating diffusing region FD may be connected to the first wires 15 by a first contact plug 17. The first contact plug 17 may penetrate the first interlayer insulating layer IL disposed the nearest (or the lowest) the front side 1*a* from among the first interlayer insulating layers IL in the pixel array region APS.

The second sub-chip CH2 may include a second substrate SB2, peripheral transistors PTR disposed thereon, and second interlayer insulating layers IL2 for covering the same. Second wires 217 may be disposed in the second interlayer insulating layers IL2. The second sub-chip CH2 may include circuits for storing electrical signals generated by the first sub-chip CH1.

Referring to FIG. 4, an antireflection structure AL may be disposed on the rear side 1*b* of the first substrate 1. The antireflection structure AL may include a first insulation layer A1, a conductive film A2, a second insulation layer A3, and a third insulation layer A4 that are sequentially stacked. The first insulation layer A1, the second insulation layer A3, and the third insulation layer A4 may include different materials. In an embodiment, the first insulation layer A1 may include an aluminum oxide, the second insulation layer A3 may include a silicon oxide, and the third insulation layer A4 may include a hafnium oxide. The conductive film A2 may have electrical conductivity and may include a titanium oxide.

In the disclosure, the first insulation layer A1 may be referred to as a first antireflection layer, the conductive film A2 may be referred to as a second antireflection layer, the second insulation layer A3 may be referred to as a third antireflection layer, and the third insulation layer A4 may be referred to as a fourth antireflection layer.

The first substrate 1 may have a first refractive index n1, the first insulation layer A1 may have a second refractive index n2, the conductive film A2 may have a third refractive index n3, and the second insulation layer A3 may have a fourth refractive index n4. A mean value {(n2+n3)/2} of the second refractive index n2 and the third refractive index n3 may be less than the first refractive index n1 and may be greater than the fourth refractive index n4. The first refractive index n1 may be 4.0 to 4.4. The second refractive index n2 may be 2.0 to 3.0. The third refractive index n3 may be 2.2 to 2.8. The fourth refractive index n4 may be 1.0 to 1.9.

The first insulation layer A1 may have a first thickness T1, the conductive film A2 may have a second thickness T2, the second insulation layer A3 may have a third thickness T3, and the third insulation layer A4 may have a fourth thickness T4. Here, the second thickness T2 may be respectively greater than the first thickness T1 and the fourth thickness T4, and may be less than the third thickness T3. The first thickness T1 may be 10 Å to 100 Å. The second thickness T2 may be 100 Å to 600 Å. The third thickness T3 may be 600 Å to 900 Å. The fourth thickness T4 may be 20 Å to 200 Å.

According to a relationship of the refractive indexes and/or a relationship of the thicknesses, light L1 input to a micro lens ML may be refracted and pass through a multi-layered structure of the antireflective structure AL and may be input to the photoelectric converter PD. Hence, the image sensor 500 with clear image quality may be provided by increasing a light receiving rate.

Regarding the image sensor 500, the antireflective structure AL may include a conductive film A2 made of a titanium oxide TiO2, and the conductive film A2 made of a titanium oxide TiO2 may generally reduce reflectance of light of all colors, and may particularly further reduce the reflectance of blue light. Hence, a quantum efficiency (QE) of the blue pixel may be increased.

The first insulation layer A1 may function as a negative fixed charge layer. Hence, dark currents and white spots may be reduced.

Further, a predetermined negative potential (voltage) may be applied to the conductive film A2 so that holes (h+) may be accumulated around the rear side 1*b* of the first substrate 1. By this, the dark currents and the white spots may be further reduced.

Referring to FIG. 3 and FIG. 4, rear side contacts BCA may be disposed on the rear side 1*b* of the first substrate 1 in the contact region BR1. First rear side vias BVS(1) may be disposed on the rear side 1*b* of the first substrate 1 in the via region BR2. Rear side conductive pads PAD and second rear side vias BVS(2) may be disposed on the rear side 1*b* of the first substrate 1 in the pad region PR. The second rear side vias BVS(2) may be gathered into groups by a predetermined number and the groups may be disposed around the rear side conductive pads PAD.

Referring to FIG. 4, the rear side contacts BCA may penetrate at least part of the antireflection structure AL and the first substrate 1. The rear side contacts BCA may be disposed in the first rear side trench 46. The rear side contacts BCA may include a first conductive pattern 52*a* and a first metal pattern 54*a*. The first conductive pattern 52*a* may conformally cover a lateral side and a bottom side of the first rear side trench 46, and may contact the conductive film A2 of the antireflection structure AL, and may be electrically connected. The first conductive pattern 52*a* may be a single layer of at least one of a titanium layer, a titanium nitride layer, and a tungsten layer or a multilayer thereof. The first metal pattern 54*a* may, for example, include aluminum. The first metal pattern 54*a* may fill the first rear side trench 46.

The rear side contacts BCA may contact the separated conductive pattern 16 of the first pixel separator DTI1. The rear side contacts BCA may be connected to the first rear side vias BVS(1) through the rear side connecting wire 52*b* to receive a predetermined negative potential, and may apply the predetermined negative potential to the separated conductive pattern 16 of the first pixel separator DTI1. The separated conductive pattern 16 may function as a common bias line. By this, holes that may remain on a surface of the first substrate 1 contacting the first pixel separator DTI1 may be held so the dark currents may be reduced.

The first rear side vias BVS(1) are respectively disposed in first holes H1. The first rear side vias BVS(1) may penetrate part of the antireflection structure AL, the first substrate 1, the first interlayer insulating layer IL1, and the second interlayer insulating layer IL2. The first rear side vias BVS(1) may connect some of first wires 15 of the first sub-chip CH1 and some of second wires 217 of the second sub-chip CH2. The first rear side vias BVS(1) may conformally fill an interior wall and a bottom side of the first holes H1. The first rear side vias BVS(1) may include a same material as the first conductive pattern 52*a* and may have a same thickness. The first rear side vias BVS(1) may be a single layer of at least one of a titanium layer, a titanium nitride layer, and a tungsten layer or a multilayer thereof.

One of the first rear side vias BVS(1) may be electrically connected to one of the rear side contacts BCA by one of the rear side connecting wires 52*c*. The rear side connecting wire 52*b* may include a same material as the first conductive pattern 52*a* and may have a same thickness. The rear side connecting wire 52*b* may be a single layer of at least one of a titanium layer, a titanium nitride layer, and a tungsten layer or a multilayer thereof.

The rear side conductive pad PAD may be disposed in the second rear side trench 60. The rear side conductive pad PAD may include a second conductive pattern 52*c* and a second metal pattern 54*b*. The second conductive pattern 52*c* may conformally cover the lateral side and the bottom side of the second rear side trench 60. The second conductive pattern 52*c* may have a same material as the first conductive pattern 52*a* and may have a same thickness. The second conductive pattern 52*c* may be a single layer of at least one of a titanium layer, a titanium nitride layer, and a tungsten layer or a multilayer thereof. The second metal pattern 54*b* may, for example, include aluminum. The second metal pattern 54*b* may fill the second rear side trench 60.

The second rear side vias BVS(2) are respectively disposed in second holes H2. The second rear side vias BVS(2) may penetrate some of the first insulation layer A1 of the antireflection structure AL, the first substrate 1, the first interlayer insulating layer IL1, and the second interlayer insulating layer IL2. The second rear side vias BVS(2) may be connected to some of the second wires 217. The second rear side vias BVS(2) may be connected to some of the first wires 15. The second rear side vias BVS(2) may conformally fill an interior wall and a bottom side of the second holes H2. The second rear side vias BVS(2) may have a same material as the first conductive pattern 52*a* and may have a same thickness. The second rear side vias BVS(2) may be a single layer of at least one of a titanium layer, a titanium nitride layer, and a tungsten layer or a multilayer thereof. One of the second rear side vias BVS(2) may be electrically connected to one of the rear side conductive pads PAD by one of the rear side connecting wires 52*c*.

A first optical black pattern 52*p* may be disposed in the antireflection structure AL in the edge region ER. The first optical black pattern 52*p* may have a same material as the first conductive pattern 52*a* and may have a same thickness. The first optical black pattern 52*p* may be a single layer of at least one of a titanium layer, a titanium nitride layer, and a tungsten layer or a multilayer thereof.

Light blocking grid patterns 48*a* may be disposed in the antireflection structure AL in the pixel array region APS. Low-refraction grid patterns 50*a* may be disposed on the light blocking grid patterns 48*a*. The light blocking grid pattern 48*a* and the low-refraction grid pattern 50*a* may overlap the first pixel separator DTI1 and may have a grid shape in a plan view. The light blocking grid pattern 48*a* may, for example, include at least one of titanium and a titanium nitride. The low-refraction grid pattern 50*a* may have a same thickness and may include a same organic material. The low-refraction grid pattern 50*a* may have a refractive index that is less than those of the color filters CF1 and CF2. For example, the low-refraction grid pattern 50*a* may have the refractive index of equal to or less than about 1.3. The light blocking grid pattern 48*a* and the low-refraction grid pattern 50*a* may prevent crosstalk among adjacent unit pixels UP.

The color filters CF1 and CF2 may be disposed among the low-refraction grid patterns 50*a* in the pixel array region APS. The color filters CF1 and CF2 may respectively have one of blue, green, and red colors. For another example, the color filters CF1 and CF2 may include other colors such as cyan, magenta, or yellow. The color filters CF1 and CF2 may be arranged in a Bayer pattern in the image sensor according to the present embodiment. For another example, the color filters CF1 and CF2 may be arranged in a 2×2 tetra pattern, a 3×3 nona pattern, or a 4×4 hexadeca pattern.

A capping pattern CFR may be respectively disposed on a first low-refraction protecting pattern 50*b* filling insides of the first rear side vias BVS(1) and a second low-refraction protecting pattern 50*c* filling insides of the second rear side vias BVS(2). The capping pattern CFR may, for example, include a photoresist material.

A protective layer 56 may be conformally disposed on a low-refraction grid pattern 50*a*, a first conductive pattern 52*a*, a first metal pattern 54*a*, a second conductive pattern 52*c*, a rear side connecting wire 52*b*, a first optical black pattern 52*p*, a capping pattern CFR, and a low-refraction residual pattern 50*r*.

A second optical black pattern CFB may be disposed on the protective layer 56. The second optical black pattern CFB may include a same material as, for example, the blue color filter.

Micro lenses ML may be disposed on the color filters CF1 and CF2 in the pixel array region APS. Edges of the micro lenses ML may contact each other and may be connected to each other. The micro lenses ML may configure an array. The micro lenses ML may be referred to as a micro lens array.

Referring to FIG. 4 to FIG. 6, the respective micro lenses ML may include a first lens layer ML1 and a second lens layer ML2 disposed on the first lens layer ML1. The second lens layer ML2 may have a smaller occupied area. A second mean curvature radius of second lens layer ML2 is smaller than a first mean curvature radius of the first lens layer ML1. The curvature radii of the first lens layer ML1 and the second lens layer ML2 may be changed depending on portions. The mean curvature radius represents the mean value of the curvature radii of the respective portions of the first lens layer ML1 and the mean value of the curvature radii of the respective portions of the second lens layer ML2. A center optical axis of the first lens layer ML1 may be substantially vertical to the rear side 1*b* of the first substrate 1 irrespective of where it is disposed in the pixel array region APS. The position of the second lens layer ML2 with respect to the center optical axis of the first lens layer ML1 may be different depending on the position in the pixel array region APS. That is, the second lens layer ML2 may be disposed in the center of the first lens layer ML1 in the center C1 of the pixel array region APS, and as moving away from the center C1 of the pixel array region APS and approaching an edge, the second lens layer ML2 may digress from the center of the first lens layer ML1 and may lean on one side. Here, the direction in which the second lens layer ML2 leans may be toward (or directed to) the center C1 of the pixel array region APS. Accordingly, the center optical axis of the second lens layer ML2 may coincide with the first lens layer ML1 at the center C1 of the pixel array region APS, and may be tilted at a predetermined angle with respect to the center optical axis of the first lens layer ML1 at the edge.

Referring to FIG. 5, the disposition of the micro lens ML of the unit pixel UP may be changed depending on where the unit pixel UP is disposed in the pixel array region APS. FIG. 5 shows a disposition of the first lens layer ML1 and the second lens layer ML2 when a distance to a corner of the pixel array region APS from the center C1 of the pixel array region APS is given as 1 field, and the distances to the unit pixel UP on three different positions P1, P2, and P3 are 0.2 field, 0.7 field, and 0.9 field. As the position of the unit pixel UP is further from the center C1 of the pixel array region APS, the degree of deviation (eccentric degree) of the second lens layer ML2 from the center optical axis of the first lens layer ML1 may increase. The eccentric degree of the second lens layer ML2 may be expressed as an angle formed by the center optical axis of the second lens layer ML2 with respect to the center optical axis of the first lens layer ML1. The eccentric degree may be a value between 0 degrees and 45 degrees. The first lens layer ML1 may also be positioned away from the center of the unit pixel UP depending on where it is positioned in the pixel array region APS. As the position of the unit pixel UP is further from the center C1 of the pixel array region APS, the degree to which the first lens layer ML1 of the corresponding unit pixel UP deviates from the center of the corresponding unit pixel UP may increase. Referring to FIG. 5, one unit pixel UP is partitioned into two parts by a pixel separator DTI.

The direction in which the first lens layer ML1 deviates from the center of the unit pixel UP and the direction in which the second lens layer ML2 deviates from the center of the first lens layer ML1 below the same (below the second lens layer ML2) may be toward (or directed to) the center C1 of the pixel array region APS.

Referring to FIG. 6, the first lens layer ML1 and the second lens layer ML2 may be made of a same material, and may be integrally combined without an interface (or a gap) therebetween. The micro lens ML positioned at the center C1 of the pixel array region APS may have a structure SV1 that is symmetric (or substantially symmetric) with respect to the center optical axis AX1. The micro lens ML positioned at the edge of the pixel array region APS may have an asymmetric structure SV2 with respect to the center optical axis AX2 because the center optical axis AX2 is tilted and the second lens layer ML2 is positioned at a skewed side toward the center of the pixel array region APS. The cross-section of the light entering the image sensor through the micro lens ML may have a circular shape FV1 at the center C1 of the pixel array region APS, and may have a triangular shape FV2 formed by distorting a circle and having rounded corners.

The dotted line in FIG. 7 is a focusing efficiency AF graph in the case of forming a micro lens with the same shape regardless of the position in the pixel array region APS. The solid line in FIG. 7 is a focusing efficiency AF graph of an image sensor according to an embodiment. The arrow in FIG. 7 indicates that, in the image sensor according to an embodiment of the disclosure, at field 0.7, the focusing efficiency AF increases by 0.5 (3−2.5).

A lens remaining layer MLR may be disposed on the second optical black pattern CFB in the edge region ER. The lens remaining layer MLR may include a same material as the micro lenses ML. An opening 35 for exposing the rear side conductive pad PAD may be formed in the lens remaining layer MLR and the protective layer 56 in the pad region PR.

FIG. 8A to FIG. 8E show cross-sectional views of a method for manufacturing a micro lens of an image sensor according to an embodiment.

Figure 8A:
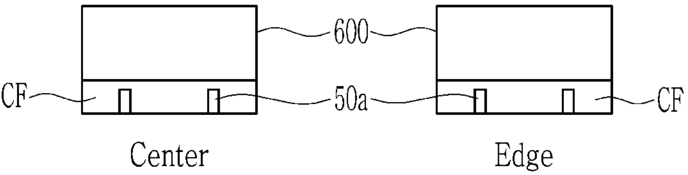
FIG. 8A to FIG. 8E show cross-sectional views of a method for manufacturing a micro lens of an image sensor according to an embodiment.

Referring to FIG. 8A, a lens material layer 600 may be formed by applying a material for micro lenses, for example, poly-carbonate (PC) or poly-methyl-meth-acrylate (PMMA) on the color filter CF.

Figure 8B:
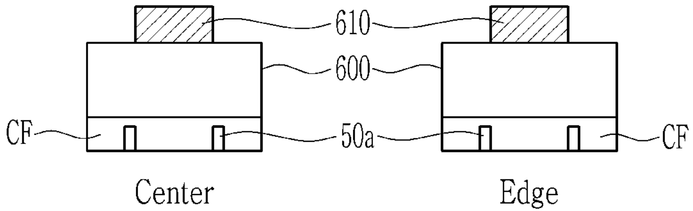

Referring to FIG. 8B, a first mask pattern 610 may be formed by applying a photoresist on the lens material layer 600 and performing a lithographic process.

Figure 8C:
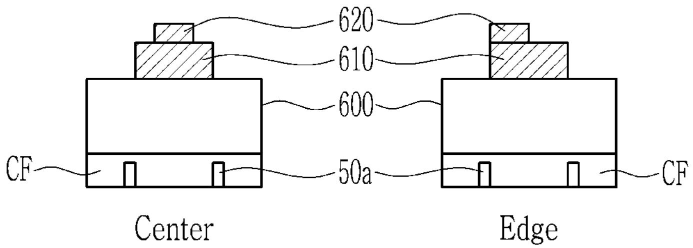

Referring to FIG. 8C, a second mask pattern 620 may be formed by applying a photoresist on the first mask pattern 610 and performing a lithographic process. The second mask pattern 620 may have a smaller diameter and height than the first mask pattern 610. A center of the second mask pattern 620 may correspond to a center of the first mask pattern 610 in the center of the pixel array region APS, and the center of the second mask pattern 620 may digress from the center of the first mask pattern 610 and may lean on one side on the edge of the pixel array region APS.

Figure 8D:
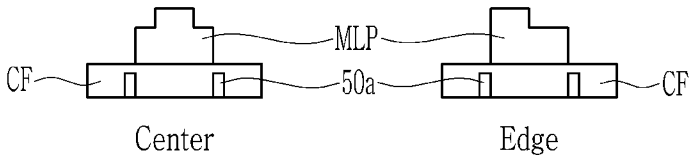

Referring to FIG. 8D, a preliminary micro lens MLP may be formed by etching the first mask pattern 610, the second mask pattern 620, and the lens material layer 600 below them. In this instance, the first mask pattern 610 and the second mask pattern 620 may be etched together.

Figure 8E:
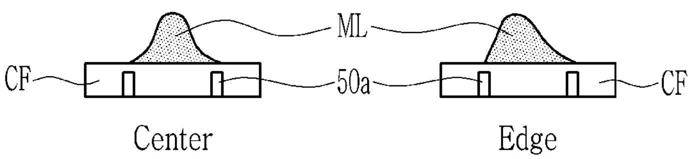

Referring to FIG. 8E, a micro lens ML may be formed by reflowing the preliminary micro lens MLP.

The micro lens ML of the image sensor according to an embodiment may also be formed by other various methods. For example, the micro lens ML may be formed by using a mold using method, or a heat imprint or ultraviolet (UV) imprint method.

Figure 9:
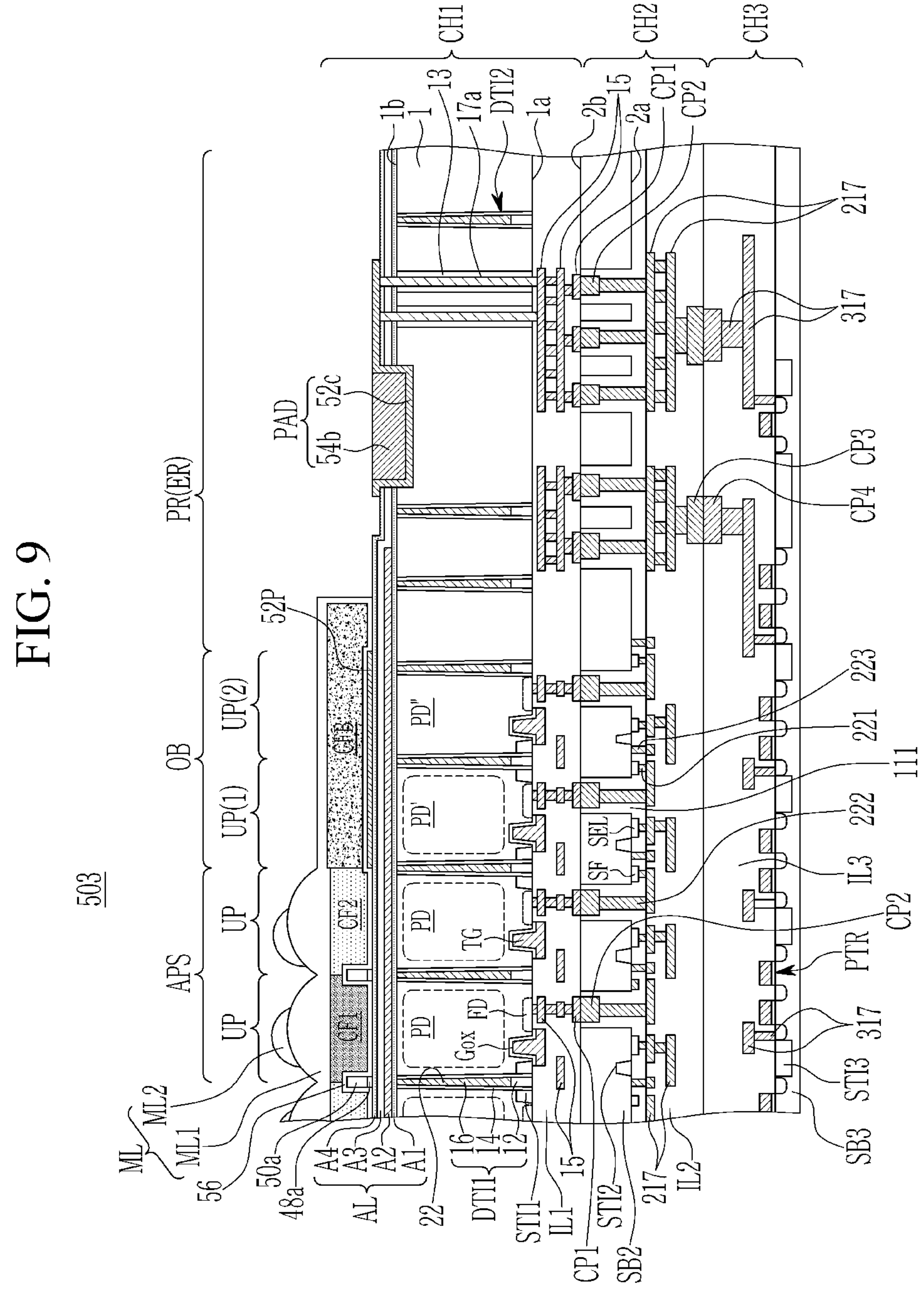
FIG. 9 shows a cross-sectional view of an image sensor according to another embodiment.

FIG. 9 shows a cross-sectional view of an image sensor according to another embodiment.

The image sensor 500 according to an embodiment of FIG. 9 may have a structure in which first to third sub-chips CH1 to CH3 are sequentially bonded.

The first sub-chip CH1 may preferably perform an image sensing function. The first sub-chip CH1 may include the first substrate 1. The first substrate 1 may, for example, be a silicon monocrystalline wafer, a silicon epitaxial layer, and a silicon on insulator (SOI) substrate. The first substrate 1 may, for example, be doped with first conductivity type impurities. For example, the first conductivity type may be a P-type. The first substrate 1 includes a front side 1*a* and a rear side 1*b* opposing each other. In the disclosure, the front side 1*a* may be referred to as a first side 1*a*, and the rear side 1*b* may be referred to as a second side 1*b*. The first substrate 1 may include a pixel array region APS, an optical black region OB, and an edge region ER.

The pixel array region APS and the optical black region OB may respectively include unit pixels UP. Micro lenses ML that correspond to the respective unit pixels UP may be disposed in the pixel array region APS. The respective micro lenses ML may gather light and may input it to the photoelectric converter PD, and may have a double-layer structure. Optical axes of the respective micro lenses ML may be inclined to have different angles depending on the position.

The optical black region OB may surround the pixel array region APS. The edge region ER may surround the pixel array region APS and the optical black region OB. The edge region ER may include a pad region PR. The pad region PR may be disposed on an outermost portion of the edge region ER.

The first pixel separator DTI1 may be disposed in the first substrate 1 to separate/limit the unit pixels UP in the pixel array region APS and the optical black region OB. The first pixel separator DTI1 may extend to the contact region BR1 of the edge region ER. The first pixel separator DTI1 may have a mesh shape in a plan view. The second pixel separator DTI2 may be disposed in the first substrate 1 in the edge region ER.

The first pixel separator DTI1 and the second pixel separators DTI2 are disposed in the deep trench 22 formed toward the rear side 1*b* from the front side 1*a* of the first substrate 1. The first pixel separator DTI1 and the second pixel separators DTI2 may be frontside deep trench isolations (FDTI). The first pixel separator DTI1 and the second pixel separators DTI2 may respectively include a buried insulation pattern 12, a separated insulation pattern 14, and a separated conductive pattern 16. The buried insulation pattern 12 may be disposed between the separated conductive pattern 16 and the first interlayer insulating layer IL1. The separated insulation pattern 14 may be provided between the separated conductive pattern 16 and the first substrate 1 and between the buried insulation pattern 12 and the first substrate 1.

The buried insulation pattern 12 and the separated insulation pattern 14 may be made of an insulating material with a refractive index that is different from that of the first substrate 1. The buried insulation pattern 12 and the separated insulation pattern 14 may, for example, include a silicon oxide. The separated conductive pattern 16 may be spaced from the first substrate 1. The separated conductive pattern 16 may include a polysilicon film or a silicon germanium film to which impurities are doped. The impurities doped to the polysilicon or the silicon germanium film may, for example, be one of boron, phosphorus, arsenide. Alternatively, the separated conductive pattern 16 may include a metal layer.

The first pixel separator DTI1 and the second pixel separators DTI2 may have horizontal cross-sections that become narrower when approaching the rear side 1*b* from the front side 1*a* of the first substrate 1. The second pixel separator DTI2 may be referred to as a substrate separator.

The photoelectric converters PD may be disposed in the first substrate 1, regarding the unit pixels UP. The photoelectric converters PD may be doped with second conductivity type impurities that are opposite to the first conductivity type. The second conductivity type may, for example, be an N-type. The N-type impurities doped to the photoelectric converter PD may make a PN junction with the P-type impurities doped to the adjacent first substrate 1 and may provide a photodiode.

First element separators STI1 provided near the front side 1*a* may be disposed in the first substrate 1. The first pixel separator DTI1 may penetrate the first element separators STI1. The first element separators STI1 may limit active regions disposed near the front side 1*a* of the respective unit pixels UP. The active regions may be provided for the transistors TX, RX, DX, and SX of FIG. 2.

Referring to FIG. 9, the transmission gate TG may be disposed on the front side 1*a* of the first substrate 1 on the respective unit pixels UP. A portion of the transmission gate TG may extend into the first substrate 1. The transmission gate TG may be a vertical type. Alternatively, the transmission gate TG may not extend into the first substrate 1 but may be planar, that is, it may be a planar type. A gate insulating layer Gox may be disposed between the transmission gate TG and the first substrate 1. A floating diffusing region FD may be disposed in the first substrate 1 on one side of the transmission gate TG. The second conductivity type impurities may, for example, be doped to the floating diffusing region FD.

The transmission gate TG, the photoelectric converter PD, and the floating diffusing region FD may be disposed in the respective unit pixels UP disposed on the first sub-chip CH1. The selection gates SEL, the source follower gates SF, and the reset gate RG may not be disposed on the first sub-chip CH1 but may be disposed on the second sub-chip CH2.

The image sensor 500 may be a rear-side light receiving image sensor. Light may be input into the first substrate 1 through the micro lens ML disposed on the rear side 1*b* of the first substrate 1. Electron-hole pairs may be generated at the PN junction by the incident light. The generated electrons may move to the photoelectric converter PD. When a voltage is applied to the transmission gate TG, the electrons may move to the floating diffusing region FD.

The first sub-chip CH1 may include a transmission gate TG and first interlayer insulating layers IL1 for covering the same on the front side 1*a* of the first substrate 1. The first element separator STI1 may be disposed to define active regions on the first substrate 1. The first sub-chip CH1 may further include internal connection contacts 17*a*. At least one of the internal connection contacts 17*a* may penetrate the buried insulation pattern 12 of the first pixel separator DTI1 in the edge region ER to connect some of the first wires 15 and the separated conductive pattern 16 of the first pixel separator DTI1, and may apply a negative bias voltage to the separated conductive pattern 16. At least the other of the internal connection contacts 17*a* may penetrate the buried insulation pattern 12 of the second pixel separator DTI2 disposed below the rear side conductive pad PAD to connect some of the first wires 15 and the separated conductive pattern 16 of the second pixel separator DTI2. A first conductive pad CP1 may be disposed on the first interlayer insulating layer IL1 on a lowermost layer. The first conductive pad CP1 may include copper.

The second sub-chip CH2 may include a second substrate SB2, selection gates SEL disposed on the front side 2*a* of the second substrate SB2, source follower gates SF, reset gates, and second interlayer insulating layers IL2 for covering them. The second element separator STI2 may be disposed to define the active regions on the second substrate SB2, and an additional floating diffusing region may be disposed in the active region. Penetration holes may be disposed in the second substrate SB2, and a penetration via 222 may be disposed in the respective penetration holes. The second conductive pad CP2 may be disposed in the penetration via 222 and may be exposed through the rear side 2*b* of the second substrate SB2. The second conductive pad CP2 may contact the first conductive pad CP1 of the first sub-chip CH1. A penetration hole insulation layer 111 may be filled around the penetration via 222 and the second conductive pad CP2. The penetration hole insulation layer 111 may be conformally disposed on the front side 2*a* of the second substrate SB2. Second wires 217 including a via 221 connected to the source follower gate SF and a via 223 connected to the active region of the second substrate SB2, and a third conductive pad CP3 may be disposed in the penetration hole insulation layer 111 and the second interlayer insulating layers IL2. The source follower gates SF may be connected to the floating diffusing regions FD of the first sub-chip CH1 through the penetration via 222 and the second conductive pad CP2.

Referring to FIG. 9, a penetration via 222 may be disposed in the penetration hole passing through the second substrate SB2, and a second conductive pad CP2 may be disposed above the penetration via 222. The penetration hole insulation layer 111 is filled around the penetration via 222 and the second conductive pad CP2 to insulate the second substrate SB2, the penetration via 222, and the second conductive pad CP2 from each other. A lower end of the penetration via 222 may be connected to the second wires 217. A width of a cross-section of the penetration via 222 may increase when becoming distant from the second conductive pad CP2, and a width of a cross-section of the second conductive pad CP2 may increase when becoming distant from the penetration via 222. The second conductive pad CP2 and the second wires 217 may include copper, and the penetration via 222 may include tungsten.

Referring to FIG. 9, the third sub-chip CH3 may include a third substrate SB3, peripheral transistors PTR disposed thereon, and third interlayer insulating layers IL3 for covering the same. A third element separator STI3 may be disposed on the third substrate SB3 to define active regions. Third wires 317 and a fourth conductive pad CP3 may be disposed in the third interlayer insulating layers IL3. An uppermost layer of the third interlayer insulating layer IL3 contacts an uppermost layer of the second interlayer insulating layer IL2. The third sub-chip CH3 may include circuits for driving the first and/or second sub-chips CH1 and CH2 or storing electrical signal generated by the first and/or second sub-chips CH1 and CH2.

Referring to FIG. 9, an antireflection structure AL may be disposed on the rear side 1*b* of the first substrate 1. The antireflection structure AL may include a first insulation layer A1, a conductive film A2, a second insulation layer A3, and a third insulation layer A4 that are sequentially stacked. The first insulation layer A1, the second insulation layer A3, and the third insulation layer A4 may include different materials. In an embodiment, the first insulation layer A1 may include an aluminum oxide, the second insulation layer A3 may include a silicon oxide, and the third insulation layer A4 may include a hafnium oxide. The conductive film A2 may have electrical conductivity and may include a titanium oxide.

In the disclosure, the first insulation layer A1 may be referred to as a first anti-reflection layer, the conductive film A2 may be referred to as a second anti-reflection layer, the second insulation layer A3 may be referred to as a third anti-reflection layer, and the third insulation layer A4 may be referred to as a fourth anti-reflection layer.

The first substrate 1 may have a first refractive index n1, the first insulation layer A1 may have a second refractive index n2, the conductive film A2 may have a third refractive index n3, and the second insulation layer A3 may have a fourth refractive index n4. T mean value $\{(n2+n3)/2\}$ of the second refractive index n2 and the third refractive index n3 may be less than the first refractive index n1 and may be greater than the fourth refractive index n4. The first refractive index n1 may be 4.0 to 4.4. The second refractive index n2 may be 2.0 to 3.0. The third refractive index n3 may be 2.2 to 2.8. The fourth refractive index n4 may be 1.0 to 1.9.

The first insulation layer A1 may have a first thickness T1, the conductive film A2 may have a second thickness T2, the second insulation layer A3 may have a third thickness T3, and the third insulation layer A4 may have a fourth thickness T4. Here, the second thickness T2 may be respectively greater than the first thickness T1 and the fourth thickness T4, and may be less than the third thickness T3. The first thickness T1 may be 10 Å to 100 Å. The second thickness T2 may be 100 Å to 600 Å. The third thickness T3 may be 600 Å to 900 Å. The fourth thickness T4 may be 20 Å to 200 Å.

According to a relationship of the refractive indexes and/or a relationship of the thicknesses, light input to a micro lens ML may be refracted and pass through a multi-layered structure of the antireflective structure AL and may be input to the photoelectric converter PD. Hence, the image sensor 500 with clear image quality may be provided by increasing a light receiving rate.

Regarding the image sensor 500, the antireflective structure AL may include a conductive film A2 made of a titanium oxide TiO2, and the conductive film A2 made of a titanium oxide TiO2 may generally reduce reflectance of light of all colors, and may particularly further reduce the reflectance of blue light. Hence, a quantum efficiency (QE) of the blue pixel may be increased.

The first insulation layer A1 may function as a negative fixed charge layer. Hence, the dark currents and the white spots may be reduced.

Further, a predetermined negative potential (voltage) may be applied to the conductive film A2 so that holes (h+) may be accumulated around the rear side 1*b* of the first substrate 1. By this, the dark currents and the white spots may be reduced.

The first optical black pattern 52*p* is disposed in the antireflection structure AL. The first optical black pattern 52*p* may be a single layer of at least one of a titanium layer, a titanium nitride layer, and a tungsten layer or a multilayer thereof.

A light blocking grid patterns 48*a* may be disposed in the antireflection structure AL in the pixel array region APS. Low-refraction grid patterns 50*a* may be respectively disposed on the light blocking grid patterns 48*a*. The light blocking grid pattern 48*a* and the low-refraction grid pattern 50*a* may overlap the first pixel separator DTI1 and may have a grid form in a plan view. The light blocking grid pattern 48*a* may, for example, at least one of titanium and a titanium nitride. The low-refraction grid pattern 50*a* may have a same thickness and may have a same organic material. The low-refraction grid pattern 50*a* may have a smaller refractive index than the color filters CF1 and CF2. For example, the low-refraction grid pattern 50*a* may have the refractive index of equal to or less than about 1.3. The light blocking grid pattern 48*a* and the low-refraction grid pattern 50*a* may prevent crosstalk among the adjacent unit pixels UP.

A protective layer 56 may be conformally disposed on the first optical black pattern 52*p*, the light blocking grid pattern 48*a*, and the low-refraction grid pattern 50*a*

The color filters CF1 and CF2 may be disposed among the low-refraction grid patterns 50*a* on the protective layer 56 in the pixel array region APS. The color filters CF1 and CF2 may respectively have one of blue, green, and red colors. For another example, the color filters CF1 and CF2 may include other colors such as cyan, magenta, or yellow. The color filters CF1 and CF2 may be arranged in a Bayer pattern in the image sensor according to the present embodiment. For another example, the color filters CF1 and CF2 may be arranged in a 2×2 tetra pattern, a 3×3 nona pattern, or a 4×4 hexadeca pattern.

Micro lenses ML may be disposed on the color filters CF1 and CF2 in the pixel array region APS. Edges of the micro lenses ML may contact each other and may be connected to each other. The micro lenses ML may configure an array. The micro lenses ML may be referred to as a micro lens array.

The micro lens ML of the image sensor according to an embodiment of FIG. 9 may have a structural characteristic shown in FIG. 5 and FIG. 6. That is, the micro lenses ML may include a first lens layer ML1 and a second lens layer ML2 disposed on the first lens layer ML1. A second radius of a second bottom cross-section of the second lens layer ML2 is smaller than a first radius of a first bottom cross-section of the first lens layer ML1.

The second mean curvature radius of the second lens layer ML2 may be smaller than the first mean curvature radius of the first lens layer ML1. The center optical axis of the first lens layer ML1 may be substantially vertical to the rear side 1*b* of the first substrate 1 irrespective of where it is disposed in the pixel array region APS. The position where the second lens layer ML2 contacts the first lens layer ML1 may be different according to the position in the pixel array region APS. That is, the second lens layer ML2 may be disposed at the center of the first lens layer ML1 in the center C1 of the pixel array region APS, and when being distant from the center C1 of the pixel array region APS and approaching the edge, the second lens layer ML2 may digress from the center of the first lens layer ML1 and may lean on to one side. Here, the direction in which the second lens layer ML2 leans may be toward (or directed to) the center C1 of the pixel array region APS. Accordingly, the center optical axis of the second lens layer ML2 may coincide with the first lens layer ML1 in the center C1 of the pixel array region APS, and may be inclined by a predetermined angle with respect to the center optical axis of the first lens layer ML1 on the edge. The farther the position of the unit pixel UP is from the center C1 of the pixel array region APS, the greater the degree to which the second lens layer ML2 deviates from the central optical axis of the first lens layer ML1. The first lens layer ML1 may digress from the center of the corresponding unit pixel UP depending on where it is disposed in the pixel array region APS. The farther the position of the unit pixel UP is from the center C1 of the pixel array region APS, the greater the degree to which the first lens layer ML1 of that unit pixel UP deviates from the center of that unit pixel UP. The direction in which the first lens layer ML1 digresses from the center of the corresponding unit pixel UP and the direction in which the second lens layer ML2 digresses from the center of the first lens layer ML1 disposed below may be the direction that proceeds to the center C1 of the pixel array region APS.

Referring to FIG. 6, the first lens layer ML1 and the second lens layer ML2 may be made of the same material, and may be integrally combined without an interface therebetween. The micro lens ML disposed at the center C1 of the pixel array region APS may have a structure SV1 that is symmetric (or substantially symmetric) with respect to the center optical axis AX1. As the center optical axis AX2 is tilted and the second lens layer ML2 leans toward the center of the pixel array region APS, the micro lens ML disposed on the edge of the pixel array region APS may have an asymmetric structure SV2 with respect to the center optical axis AX2. The cross-section of the light entering the image sensor through the micro lens ML may have a circular shape FV1 at the center C1 of the pixel array region APS, and may have a triangular shape FV2 formed by distorting a circle and having rounded corners.

As described, when the micro lens ML is formed to have a double-layered structure including the first lens layer ML1 and the second lens layer ML2, and the optical axis of the second lens layer ML2 that is an upper lens is dispose to be inclined toward the center of the active region of the image sensor when approaching the edge from the center C1 of the pixel array region APS, as shown in FIG. 7, focusing efficiency AF on the edge of the pixel array region APS may be prevented from being severely deteriorated compared to the focusing efficiency AF at the center.

The disclosure is not limited to the embodiments, but may be implemented in various different forms. It may be understood by those skilled in the art to which the disclosure pertains that the disclosure may be implemented in other specific forms without changing the spirit or essential features thereof. Therefore, it should be understood that the aforementioned embodiments are illustrative in terms of all aspects and are not limited.

What is claimed is:

1. An image sensor comprising:

a first substrate comprising:

a first side, a second side that is opposite to the first side, a pixel array region comprising unit pixels, and an edge region surrounding the pixel array region; and a micro lens array on the second side, the micro lens array comprising micro lenses, wherein each of the micro lenses comprises a first lens layer and a second lens layer on the first lens layer, wherein a second mean curvature radius of the second lens layer is smaller than a first mean curvature radius of the first lens layer, wherein a first eccentric degree of the second lens layer on an edge of the pixel array region is greater than a second eccentric degree of the second lens layer at a center of the pixel array region, wherein each of the first eccentric degree and the second eccentric degree corresponds to a degree to which a center optical axis of the second lens layer deviates from the center optical axis of the first lens layer, and wherein a direction in which the center optical axis of the second lens layer is eccentric from the center optical axis of the first lens layer is toward the center of the pixel array region.

2. The image sensor of claim 1, wherein the first eccentric degree increases in accordance with a distance from the center of the pixel array region.

3. The image sensor of claim 2, wherein the first eccentric degree and the second eccentric degree is an angle formed by the center optical axis of the second lens layer with respect to the center optical axis of the first lens layer, and wherein the first eccentric degree is a value between zero (0) degree to 45 degrees.

4. The image sensor of claim 3, wherein the second eccentric degree is zero (0) degree.

5. The image sensor of claim 1, wherein the first lens layer and the second lens layer are integrally combined without an interface therebetween.

6. The image sensor of claim 5, wherein a second radius of a second bottom cross-section of the second lens layer is smaller than a first radius of a first bottom cross-section of the first lens layer.

7. The image sensor of claim 1, wherein a second radius of a second bottom cross-section of the second lens layer is smaller than a first radius of a first bottom cross-section of the first lens layer.

8. The image sensor of claim 1, further comprising color filters and an antireflection structure between the second side of the first substrate and the micro lens array.

9. The image sensor of claim 8, wherein the first substrate comprises photoelectric converters.

10. The image sensor of claim 8, further comprising a light blocking grid pattern and a low-refraction grid pattern on the antireflection structure and between the color filters.

11. The image sensor of claim 8, further comprising an optical black pattern on the antireflection structure and surrounding the pixel array region.

12. The image sensor of claim 11, further comprising a lens remaining layer on the optical black pattern.

13. The image sensor of claim 1, further comprising:

a second substrate on the first side of the first substrate, and a peripheral transistor on the second substrate.

14. The image sensor of claim 13, further comprising wiring layers and interlayer insulating layers between the first substrate and the second substrate.

15. The image sensor of claim 1, further comprising:

a second substrate and a third substrate on the first side of the first substrate;

a first wiring layer and a first interlayer insulating layer between the first substrate and the second substrate;

a second wiring layer and a second interlayer insulating layer between the second substrate and the third substrate; and a third wiring layer and a third interlayer insulating layer on the third substrate.

16. The image sensor of claim 15, wherein the second substrate, the first wiring layer, and the second wiring layer comprise a selection gate and a source follower gate, and wherein the third substrate and the third wiring layer comprise a peripheral transistor.

17. An image sensor comprising:

a first substrate comprising:

a first side, a second side that is opposite to the first side, a pixel array region comprising unit pixels, and an edge region;

an antireflection structure on the second side;

a pixel separator on the first substrate and separating the unit pixels;

a color filter in the antireflection structure;

a micro lens array on the color filter and comprising micro lenses;

a first interlayer insulating layer on the first side of the first substrate;

a first wiring layer in the first interlayer insulating layer;

a second interlayer insulating layer below the first interlayer insulating layer;

a second wiring layer in the second interlayer insulating layer; and a second substrate below the second interlayer insulating layer, wherein each of the micro lenses comprises a first lens layer and a second lens layer on the first lens layer, wherein a second mean curvature radius of the second lens layer is smaller than a first mean curvature radius of the first lens layer, wherein a first eccentric degree of the second lens layer on an edge of the pixel array region is greater than a second eccentric degree of the second lens layer at a center of the pixel array region, wherein each of the first eccentric degree and the second eccentric degree corresponds to a degree to which a center optical axis of the second lens layer deviates from the center optical axis of the first lens layer, and wherein a direction in which the center optical axis of the second lens layer is eccentric from the center optical axis of the first lens layer is toward a center of the pixel array region.

18. The image sensor of claim 17, wherein the first eccentric degree increases in accordance with a distance from the center of the pixel array region, and wherein a second radius of a second bottom cross-section of the second lens layer is smaller than a first radius of a first bottom cross-section of the first lens layer.

19. An image sensor comprising:

a first sub-chip comprising:

a first substrate comprising:

a first side, a second side that is opposite to the first side, a pixal array region comprising unit pixels, and an edge region, an antireflection structure on the second side, a pixel separator on the first substrate and separating the unit pixels, a color filter in the antireflection structure, a micro lens array on the color filter, a first interlayer insulating layer on the first side of the first substrate, and a first wiring layer in the first interlayer insulating layer;

a second sub-chip comprising:

a second substrate below the first interlayer insulating layer, a second interlayer insulating layer below the second substrate, and a second wiring layer in the second interlayer insulating layer;

a third sub-chip comprising:

a third interlayer insulating layer below the second interlayer insulating layer, a third wiring layer in the third interlayer insulating layer, and a third substrate below the third interlayer insulating layer, and micro lenses comprising a first lens layer and a second lens layer on the first lens layer, wherein a second mean curvature radius of the second lens layer is smaller than a first mean curvature radius of the first lens layer, wherein a first eccentric degree of the second lens layer disposed on an edge of the pixel array region is greater than a second eccentric degree of the second lens layer disposed at a center of the pixel array region, wherein each of the first eccentric degree and the second eccentric degree corresponds to a degree to which a center optical axis of the second lens layer deviates from the center optical axis of the first lens layer, and wherein a direction in which the center optical axis of the second lens layer is eccentric from the center optical axis of the first lens layer is toward a center of the pixel array region.

20. The image sensor of claim 19, wherein the first eccentric degree increases in accordance with a distance from the center of the pixel array region, and wherein a second radius of a second bottom cross-section of the second lens layer is smaller than a first radius of a first bottom cross-section of the first lens layer.

* * * * *